(12) United States Patent
Fukazu et al.

(10) Patent No.: US 6,648,062 B2
(45) Date of Patent: Nov. 18, 2003

(54) HEAT SINK-TYPE COOLING DEVICE

(75) Inventors: Tomohiro Fukazu, Wako (JP); Tomoya Yamagishi, Wako (JP); Hirotomo Koike, Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/916,322

(22) Filed: Jul. 30, 2001

(65) Prior Publication Data
US 2002/0011327 A1 Jan. 31, 2002

(30) Foreign Application Priority Data
Jul. 31, 2000 (JP) .......................... 2000-232331

(51) Int. Cl.[7] .............. F28F 7/00; H05K 7/20; H01L 23/34
(52) U.S. Cl. .............. 165/80.3; 257/714; 361/699; 361/703; 165/80.4; 165/185
(58) Field of Search .............. 165/80.4, 109.1, 165/153, 177; 361/699; 257/714

(56) References Cited

U.S. PATENT DOCUMENTS

| | | | | |
|---|---|---|---|---|
| 3,327,776 A | * | 6/1967 | Butt | 165/80.4 |
| 3,542,124 A | * | 11/1970 | Manfredo | 165/166 |
| 4,282,927 A | * | 8/1981 | Simmons | 165/166 |
| 4,535,386 A | * | 8/1985 | Frey, Jr. et al. | 165/104.33 |
| 4,765,397 A | * | 8/1988 | Chrysler et al. | 165/80.4 |
| 4,884,168 A | * | 11/1989 | August et al. | 165/80.4 |
| 5,653,285 A | * | 8/1997 | Lee | 165/185 |
| 5,835,345 A | * | 11/1998 | Staskus et al. | 361/699 |
| 5,983,997 A | * | 11/1999 | Hou | 165/80.4 |
| 5,984,000 A | * | 11/1999 | Nakamura et al. | 165/153 |
| 6,169,658 B1 | * | 1/2001 | Arena et al. | 165/80.4 |
| 6,244,332 B1 | * | 6/2001 | Gesklin et al. | 165/80.3 |
| 6,273,183 B1 | * | 8/2001 | So et al. | 165/109.1 |

FOREIGN PATENT DOCUMENTS

| | | |
|---|---|---|
| JP | 09-019163 | 1/1997 |
| JP | 09-252066 | 9/1997 |
| JP | 10-256766 | 9/1998 |
| JP | 10-261886 | 9/1998 |

* cited by examiner

Primary Examiner—Henry Bennett
Assistant Examiner—Tho V Duong
(74) Attorney, Agent, or Firm—Arent Fox Kintner Plotkin & Kahn, PLLC

(57) ABSTRACT

A heat sink-type cooling device is provided which can enhance the amount of heat dissipated without increasing the size of the fins, and which is miniaturized and has high cooling capacity. A heat sink-type cooling device comprises a heat sink that is provided with a passage through which coolant flows, and that removes heat from electronic devices contacting with the upper surface of the heat sink. Fin groups are provided in the passage, each of which is comprised of a plurality of fins that are disposed in parallel with the direction of the coolant flow and are aligned in the thickness direction thereof. Fins of a fin group and other fins of another fin group adjoining the fin group in the direction of the flow are placed at a distance in the thickness direction of the fins.

5 Claims, 7 Drawing Sheets

HEAT SINK-TYPE COOLING DEVICE

BACKGROUND OF THE INVENTION

1. Field of the Invention

The present invention relates to a cooling device that is provided with a heat sink (hereinbelow referred to as a heat sink-type cooling device), and in particular, to a heat sink-type cooling device that employs a liquid cooling technique to improve cooling efficiency.

2. Description of the Related Art

In vehicles such as electric vehicles and fuel cell powered vehicles which employ an alternating current motor as a power source, semiconductor components such as switching elements (e.g., IGBT (Insulated Gate Bipolar Transistor)) and DC/DC converters are mounted in a power converter in order to convert a direct current supplied from a battery into an alternating current. In such a power converter, the amount of heat generated by the switching elements is significantly large and is increasing as the size of power converters increases year by year; therefore it is necessary to cool down the power converter more efficiently.

A structure for cooling down power converters is disclosed, for example, in Japanese Unexamined Patent Application, First Publication No. Hei 9-19163. According to the structure, the power converter is provided with a heat sink in which electronic semiconductor components are placed on the flat top surface, and a number of cooling grooves are formed on the bottom surface to which a base is fixed, and with a cooling groove section which supplies cooling water to a space enclosed by the base and the bottom surface of the heat sink to circulate the cooling water. The cooling groove section comprises the cooling grooves and a number of thin fins that is used for heat exchange in which the cooling water flows through spaces formed by adjoining fins.

The above-described structure makes it possible to enhance the amount of heat dissipated by means of the fins, so that it is advantageous in that a heat sink-type cooling device having high cooling capacity can be achieved. However, since the flow of the cooling water flowing along the fins flows laminarly in the spaces formed by adjoining fins, only cooling water flowing near the fins contributes to heat exchange. Accordingly, the amount of heat dissipated by means of the fins will eventually reach an upper limit, and hence it is impossible to obtain an expected cooling capacity. Although it is possible to enhance the amount of heat dissipated by expanding the area of the fins, a problem will arise in that the height of the heat sink increases and the size of the heat sink increases.

SUMMARY OF THE INVENTION

It is therefore an object of the present invention to provide a heat sink-type cooling device which has high cooling capacity with a miniaturized structure, and which can enhance the amount of heat dissipated without increasing the size of the fins.

In order to achieve the above object, a heat sink-type cooling device according to the present invention comprises: a heat sink (for example, a heat sink 5 in the embodiment) which is provided with a passage (a passage 6 in the embodiment) through which coolant flows, and a plurality of fin groups (for example, fin groups 21 in the embodiment) which are provided in the passage and each of which is comprised of a plurality of fins (for example, fins 22 in the embodiment) that are disposed in parallel with the direction of the coolant flow and are aligned in the thickness direction of the fins, wherein the heat sink removes heat from a heat source (for example, electronic devices 8 in the embodiment) which contacts with a surface (for example, an upper surface 7 in the embodiment) of the heat sink, and a fin of a fin group and another fin of another fin group adjoining to the fin group in the direction of the flow are arranged at a distance in the thickness direction of the fins. With such a structure, when the coolant flows from a fin group to another fin group, the coolant flow becomes turbulent due to the structure in which the adjoining fin groups are placed at a distance, so that it is possible to remove greater amounts of heat from the heat source through the fins. Consequently, the cooling capacity can be enhanced as compared with that in conventional cooling devices.

In the present invention, it is preferable that one of the surfaces be provided with a heat source arrangement portion (for example, apparatus arrangement portions 26 in the embodiment) for arranging the heat source at the position closest to the fin groups. With such a structure, in addition to the above-described effect, it is possible to arrange the heat source at the positions closest to the fin groups on the surface where the heat source can be placed. For this reason, it is possible to efficiently remove heat from the heat source that should be further cooled in preference to other devices.

In the present invention, it is preferable that the fin group and another fin group adjoining the fin group in the direction of the flow be closely arranged. With such a structure, in addition to the above-described effect, it is possible to enhance an effect obtained by the turbulent flow, which is generated by an arrangement in which the fin groups are arranged at a distance, to the maximum extent. For this reason, it is possible to further enhance the capacity to remove heat.

In the present invention, it is preferable that the fin groups be arranged in a manner such that coolant flow from two adjoining spaces formed by three adjoining fins of the upstream fin group joins at a space between adjoining fins of the downstream fin group to make the coolant flow turbulent. It is also preferable that the fin groups be arranged in a manner such that the coolant flowing near the surfaces of the fins of an upstream fin group flows at portions distant from the surfaces of the fins of a downstream fin group adjoining the upstream fin group in the direction of the flow, and a part of the coolant flowing at the spaces between the fins of the upstream fin group flows near the surfaces of the fins of the downstream fin group. With such structures, it is possible to efficiently remove heat from the fins.

In the present invention, it is preferable that the pitch of the fin be made as narrow as possible and the thickness of the fin be made as thick as possible without blocking the flow. With such a structure, it is possible to lower the temperature of the heat source to the maximum extent.

DETAILED DESCRIPTION OF THE PREFERRED EMBODIMENTS

Figure 1:
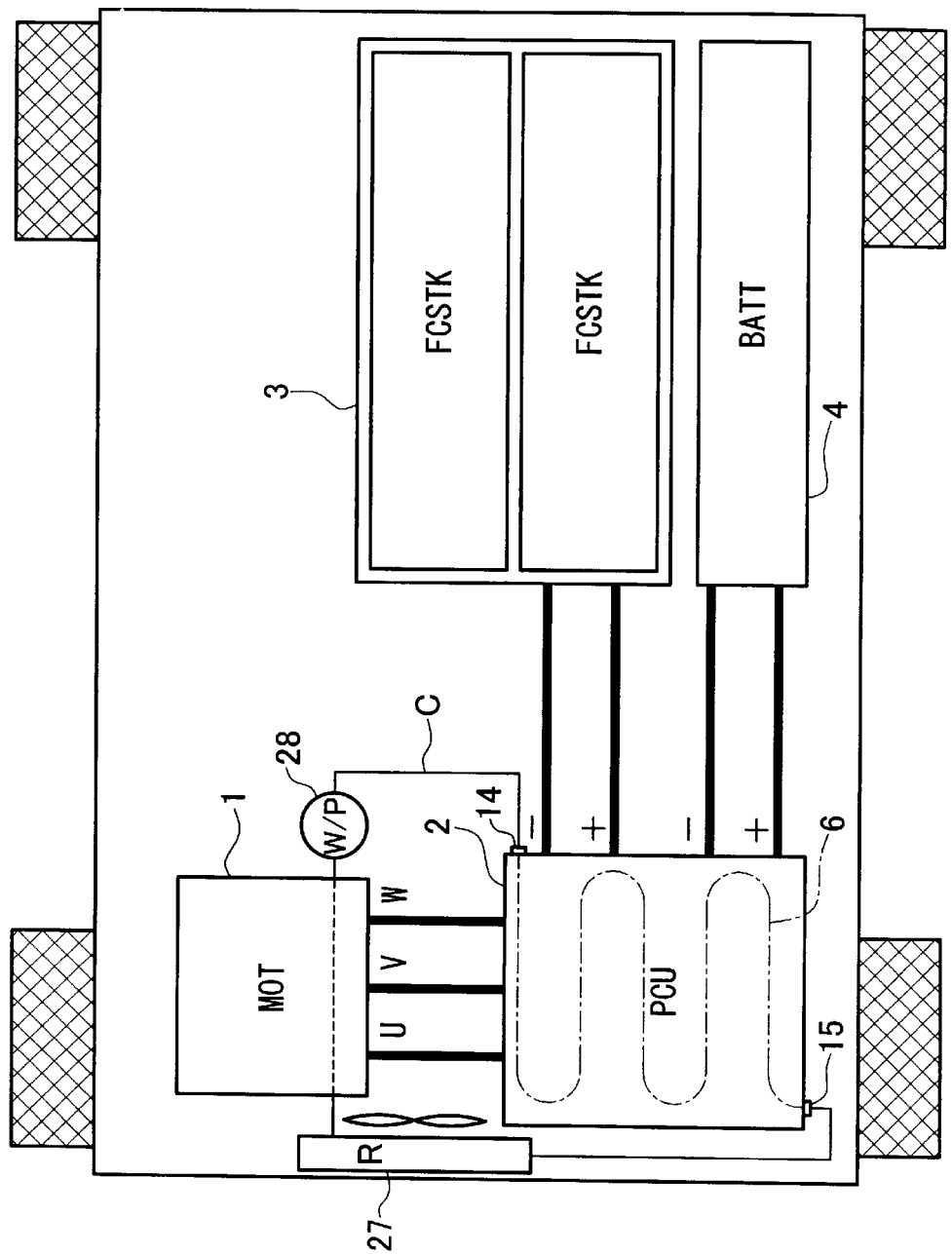
FIG. 1 is a schematic diagram showing the structure of a fuel cell vehicle according to an embodiment of the present invention.

A fuel cell vehicle according to an embodiment of the present invention will be explained with reference to the drawings. FIG. 1 is a schematic diagram showing the structure of a fuel cell vehicle in accordance with an embodiment of the present invention. In FIG. 1, reference numeral 1 denotes a main motor (MOT in the figure) for driving the vehicle. The main motor 1 is connected, via a power control unit (PCU in the figure) 2, to a fuel cell stack (FCSTK in the figure) 3 and a battery (BATT in the figure) 4 used for, for example, regeneration of electric power. Reference numeral 27 denotes a radiator (R in the figure). The radiator 27 and a water pump (W/P in the figure) 28 constitute a coolant passage C that communicates with a passage 6 of a heat sink 5, which will be described below.

Figure 2:
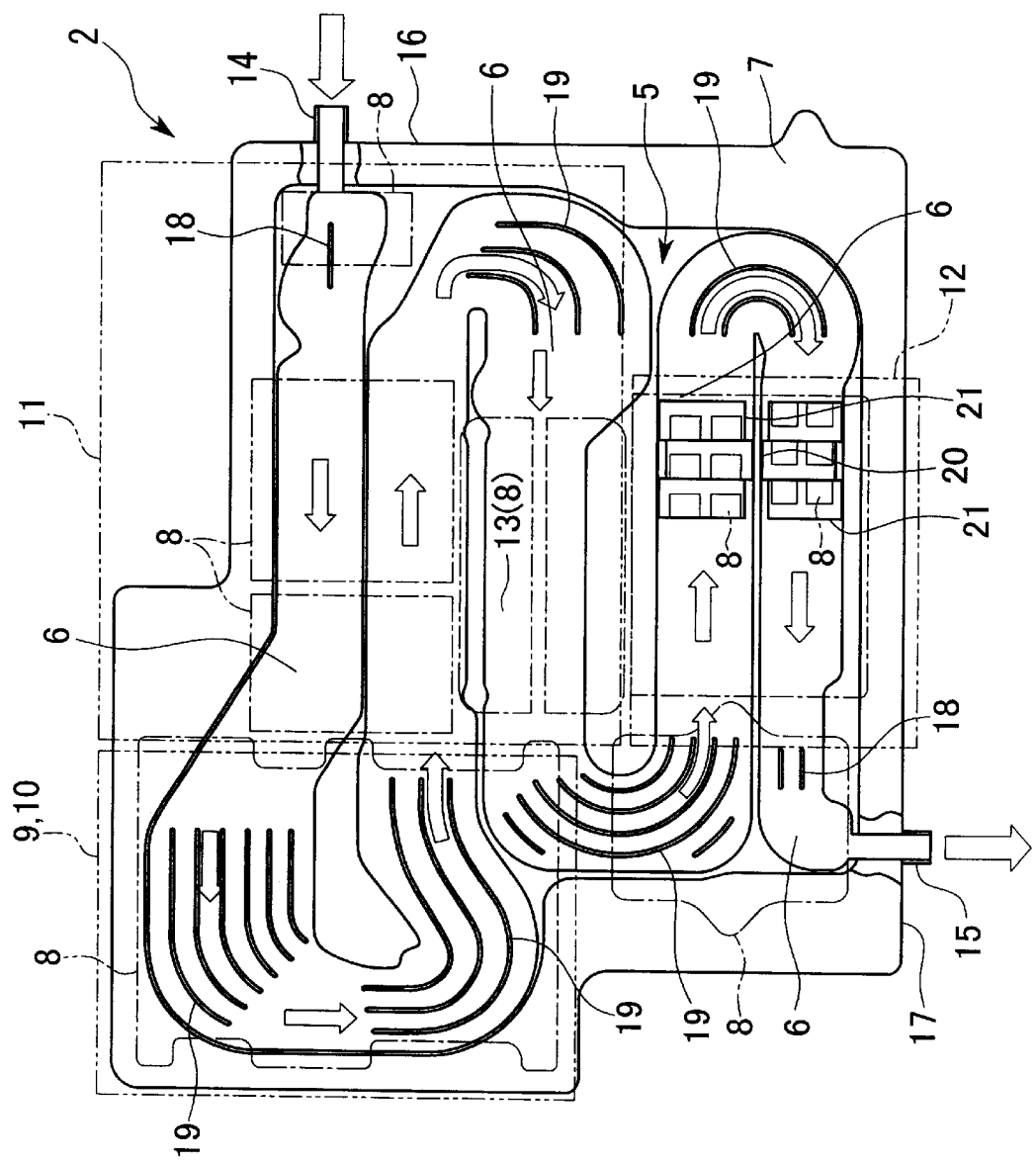
FIG. 2 is a plan view showing an arrangement of a heat sink according to the embodiment of the present invention and various electronic devices mounted on the heat sink.

FIG. 2 shows an arrangement of the power control unit 2 that is comprised of the heat sink 5 and various devices placed thereon.

Specifically, the power control unit 2 is provided with the heat sink 5 made from a substance having high thermal conductivity such as aluminum. The heat sink 5 is provided with the passage 6 through which the coolant flows, and removes heat from heat sources such as electronic devices 8 which contact with one of the surfaces of the heat sink 5, such as a top surface 7, and which are mounted on the surface.

As indicated by chain lines shown in FIG. 2, the power control unit 2 is also provided with a power drive unit 9 for a supercharger, a power drive unit 10 for a coolant pump, a high voltage conversion circuit 11, and a power drive unit 12 for the main motor 1, each of which includes the electronic device(s) 8.

The power drive unit 9 for the supercharger supplies electric power to the supercharger (not shown in the figures) that supplies the fuel cell stack 3 with air as oxidizing agent gas. The power drive unit 10 for the coolant pump supplies electric power to the coolant pump (not shown in the figures) that supplies the fuel cell stack 3 and the like with the coolant. The high voltage conversion circuit 11 converts an output voltage of the fuel cell stack 3 into a predetermined voltage, and determines allocations of electric power for the fuel cell stack 3, the battery 4, and the power drive units 9, 10, and 12. The high voltage conversion circuit 11 is also provided with a reactor 13, which is one of the electronic devices 8 and is used for smoothing current. The power drive unit 12 for the main motor 1 is provided with, for example, condensers and a semiconductor current conversion circuit such as an inverter and a converter which are switching circuits for driving the main motor 1.

Although not shown in the figures, in addition to the battery 4, a capacitor may be interposed between the high voltage conversion circuit 11 and the power drive unit 12 for the main motor 1.

The passage 6 of the heat sink 5 connects an inlet 14 for the coolant and an outlet 15 for the coolant and has a meandering shape. This meandering shape makes it possible to remove greater amounts of heat. As shown in FIG. 2, the inlet 14 is an opening which is provided on the right sidewall 16 of the power control unit 2, and the outlet 15 is an opening which is provided on the front (the lower side in FIG. 2) wall 17 of the power control unit 2.

Specifically, the passage 6 begins at the inlet 14, and it extends beneath the high voltage conversion circuit 11, and then it bends counterclockwise under the area where the power drive unit 9 for the supercharger and the power drive unit 10 for the coolant pump are placed. Next, it extends toward the inlet 14, and it bends clockwise in the vicinity of the inlet 14, and then it extends beneath the reactor 13. Next, it bends counterclockwise, and it extends beneath the power drive unit 12 for the main motor 1, and then it bends clockwise in the vicinity of the right sidewall 16, and then it extends beneath the power drive unit 12 for the main motor 1 again to communicate with the outlet 15. Ribs 18 are placed at several locations in linear portions of the passage 6, and ribs 19 are placed at turnings of the passage 6, thereby guiding the coolant flow.

The inlet 14 of the passage 6 thus configured is connected to the water pump 28, and the outlet 15 is connected to the radiator 27.

Figure 3:
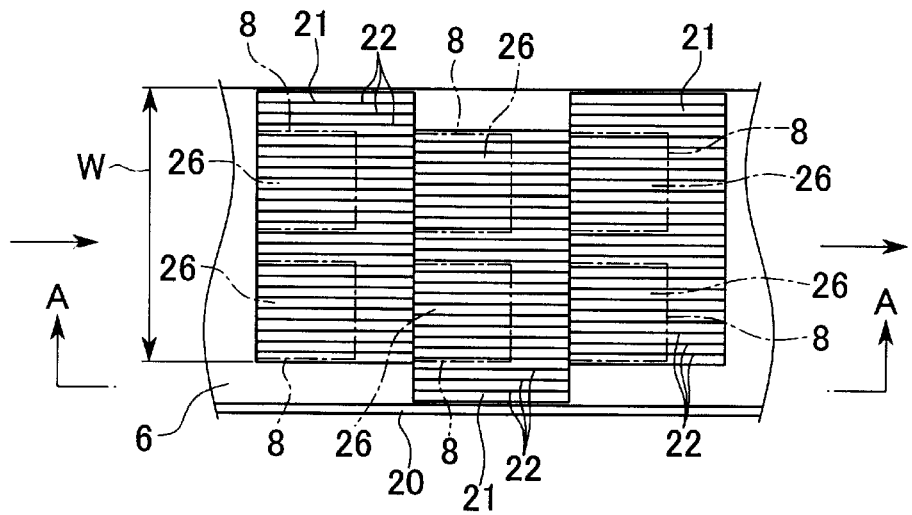
FIG. 3 is a plan view showing the structure of an essential part of the structure shown in FIG. 2.
Figure 4:
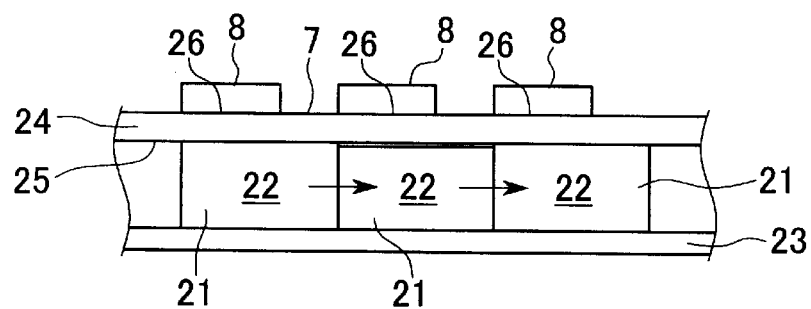
FIG. 4 shows a cross sectional view along the line A—A shown in FIG. 3.

A partition wall 20 divides the space below the power drive unit 12 for the main motor 1 into a portion extending toward the right sidewall 16 and a portion extending toward the outlet 15, thereby forming the passage 6. As shown in FIG. 3, a plurality of fin groups 21 are placed in a portion of the passage 6 below the power drive unit 12 for the main motor 1. The number of the fin groups 21 disposed in parallel with the direction of the coolant flow is not limited. The fin groups 21 are arranged in parallel with the coolant flow, and each fin group 21 is provided with a plurality of fins 22 which are aligned in the thickness direction (i.e., the direction perpendicular to the direction of the coolant flow) thereof. As shown in FIG. 4 (which shows a cross sectional view along the line A—A shown in FIG. 3), each fin 22 extends from the bottom wall 23 of the heat sink 5 to a position close to the bottom surface 25 of the top wall 24 of the heat sink 5. Each fin 22 may be disposed so as to extend from the bottom surface 25 of the top wall 24 of the heat sink 5 to the bottom wall 23.

The fin groups 21 are successively disposed in parallel with the direction of the coolant flow. Each fin group 21 may be composed of the fins 22 that are arranged within a fixed width W as shown in FIG. 3, and it may also be composed of the fins 22 that are arranged over the width of the passage 6. In the present embodiment, since the width W of the fin groups 21 is slightly narrower than the width of the passage 6, no fins 22 are disposed in the space between a sidewall of the passage 6 and a side of the fin group 21. In addition, FIG. 3 shows an upstream portion of the passage 6 below the power drive unit 12.

Figure 5:
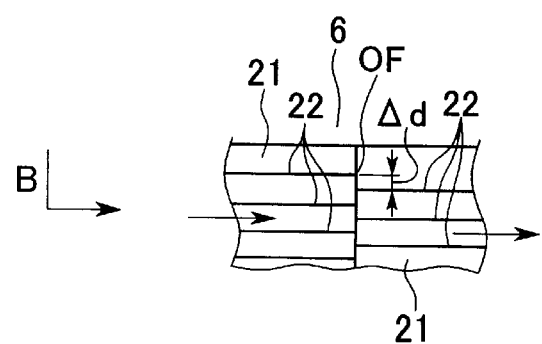
FIG. 5 shows an enlarged view of an essential part of the structure shown in FIG. 3.

As shown in FIG. 5, fins 22 of a fin group 21 and other fins 22 of another fin group 21 adjoining the fin group 21 in parallel with the direction of the flow are placed at a distance in the thickness direction of the fins 22. In other words, adjoining fin groups 21 are placed at a distance of an offset Δd in the width direction of the passage 6. Moreover, the fin group 21 is placed so as to closely contact with another fin group 21 that adjoins the fin group 21 in parallel with the direction of the flow.

Device arrangement portions 26 on which heat sources are placed are formed in the area closest to the fin groups 21, specifically, an area on the top surface 7 of the power control unit 2 corresponding to the area where the fin groups 21 are disposed.

The shapes of the fins 22 were calculated in accordance with a simulation described below. The simulation was performed on an assumption that the fins 22 are placed directly under the power drive unit 12 for the main motor 1 as shown in FIG. 2. Specifically, the fins 22 are placed directly under switching circuits for driving a motor that produces a large amount of heat, for example, switching elements provided in a semiconductor current conversion circuit such as an inverter and a converter.

In the simulation, conditions used for an analysis were as follows: atmospheric temperature was set to 80° C.; the temperature of the coolant was set to 65° C.; the flow rate of the coolant was set to 16 liters/minute; and the power consumption of each chip of the electronic devices 8 was set to 137.5 W.

Figure 6:
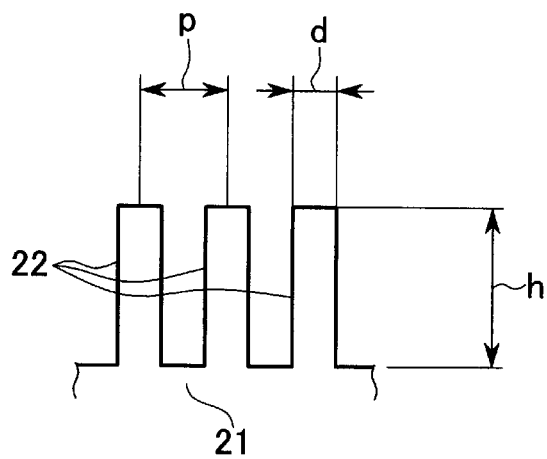
FIG. 6 shows a side view of the fins viewed along the direction indicated by an arrow B shown in FIG. 5.

FIG. 6 shows parameters of the fin 22 used for the analysis. In the simulation, a pitch p (mm), a thickness (a fin width) d (mm), and a fin height h (mm) (which was fixed to 20 mm) were used as the parameters of the fin 22, and three values of the thickness d (mm) of the fin 22 (i.e., d=0.6 mm, 0.9 mm, and 1.2 mm) were used. The maximum temperature (° C.) of a chip, which is an example of a heat source, and a pressure loss (kPa) of a flow passage were calculated for each combination of three values of the thickness d and three values of the pitch p.

Figure 7:
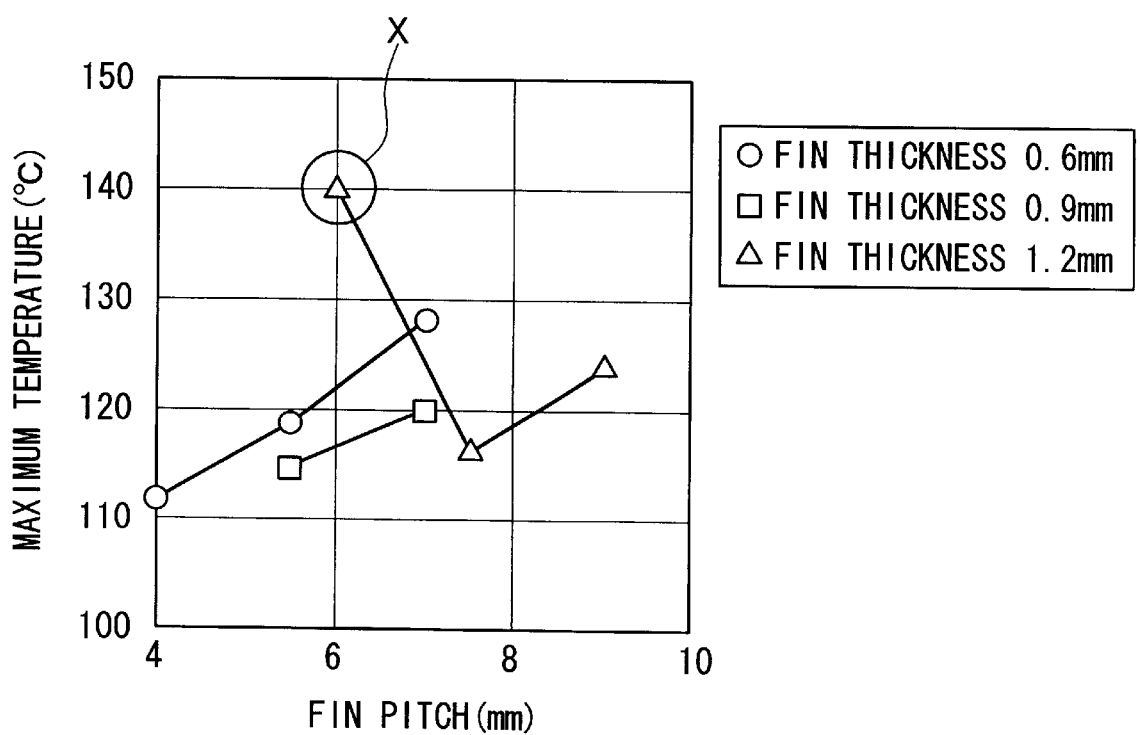
FIG. 7 is a graph showing the relationships of fin thickness, fin pitch, and maximum temperature.
Figure 8:
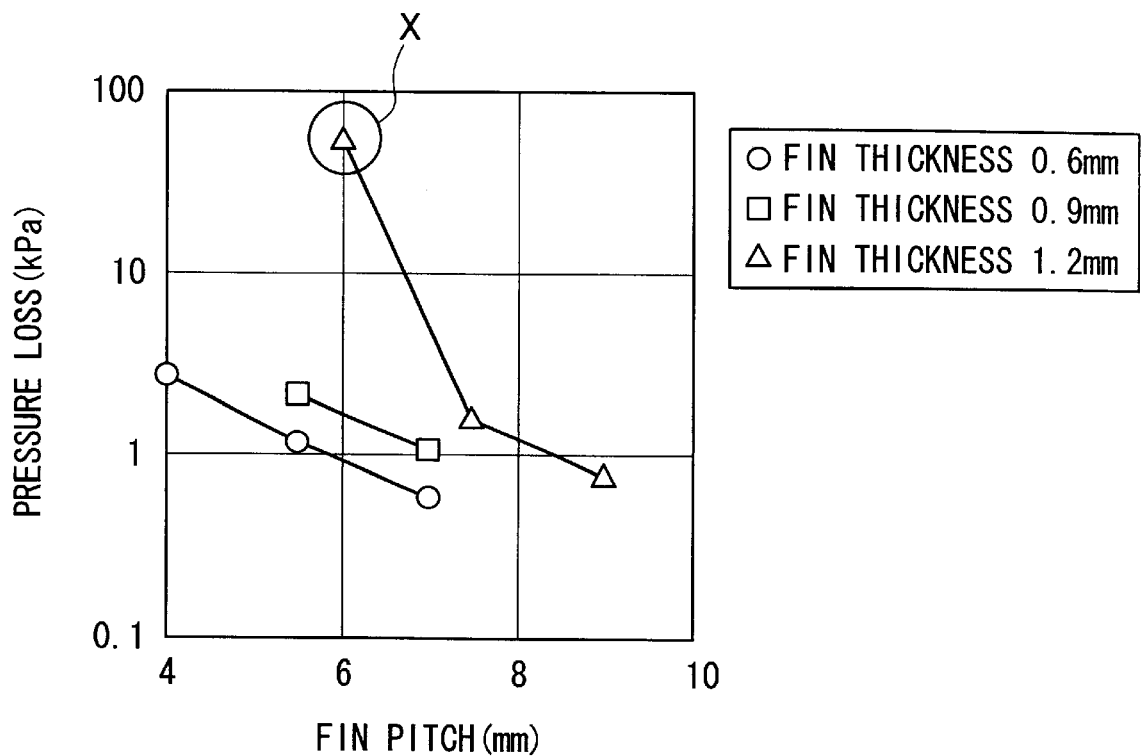
FIG. 8 is a graph showing the relationships of fin thickness, fin pitch, and pressure loss.

The results of the analysis shown in FIGS. 7 and 8 demonstrate the following.

(1) As the pitch p of the fin 22 becomes narrower, the maximum temperature of the chip falls (refer to FIG. 7) and the pressure loss increases (refer to FIG. 8).

(2) If the pitch p is fixed, as the thickness d of the fin 22 becomes thicker, the maximum temperature of the chip basically falls (refer to FIG. 7) and the pressure loss increases (refer to FIG. 8).

(3) If the thickness d of the fin 22 is too great and the pitch p of the fin 22 is too narrow, the maximum temperature of the chip rises (refer to reference symbol X shown in FIGS. 7 and 8). This is because the flow is blocked at offset sections where the fins 22 adjoining in parallel with the direction of the flow are placed at a distance of a predetermined offset, and hence the pressure loss increases and the cooling effect decreases.

In view of the above, it is desirable that the pitch p of the fin 22 be made as narrow as possible and that the thickness d of the fin 22 be selected so as not to block the flow even if the pitch p at a minimum. In the heat sink 5 according to the present embodiment, the pitch p is set to 5.5 mm and the thickness d is set to 0.6 mm.

In addition, the optimum offset position and the optimum interval between adjoining offset sections were analyzed by a simulation using the fin 22 in which the pitch p was set to 5.5 mm and the thickness d was set to 0.6 mm.

Figure 9:
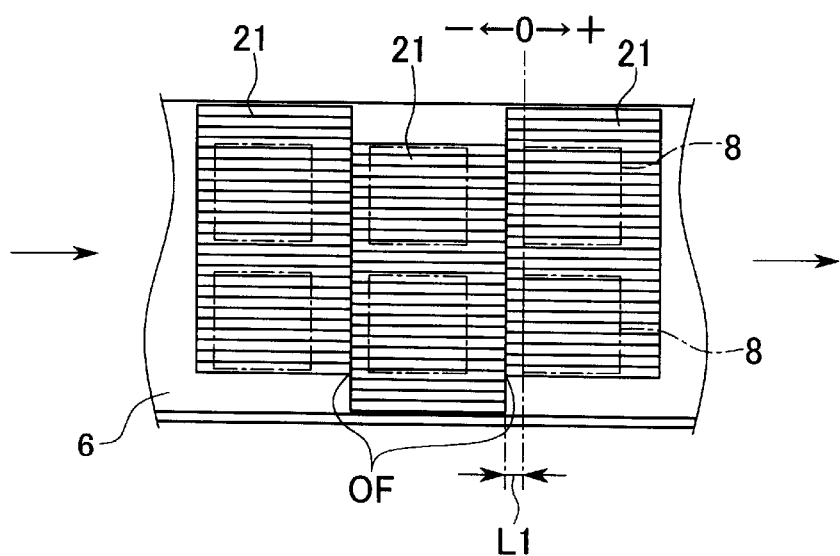
FIG. 9 is an explanatory diagram showing offset positions of fins.
Figure 10:
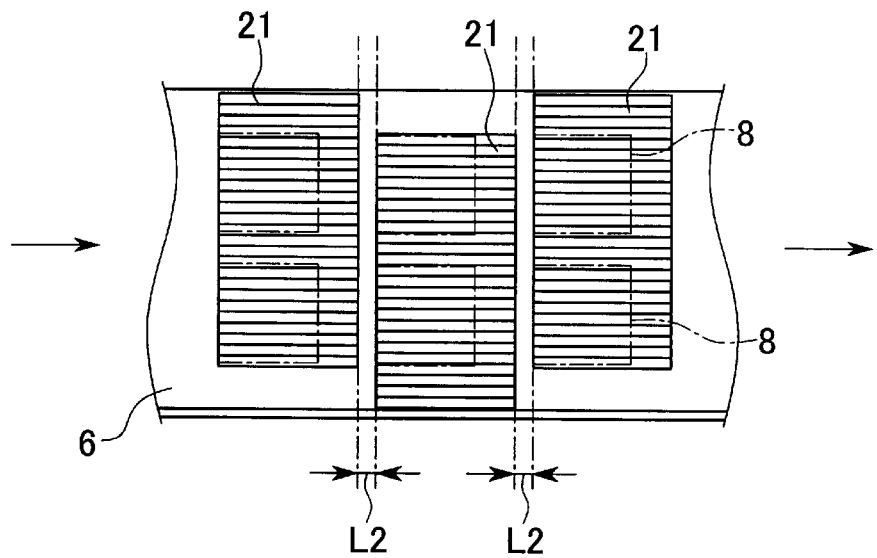
FIG. 10 is an explanatory diagram showing intervals between adjoining offset sections of the fins.

As shown in FIG. 9, the distance L1 from the front position of a chip of the electronic device 8 to the closest offset section OF defines an offset position. The distance L1 is zero if the offset position coincides with the front position of the chip, and it is negative if the offset position is located in the upstream of the front position, and it is positive if the offset position is located in the downstream of the front position. In FIG. 9, the distance L1 is set to −2 mm. As shown in FIG. 10, the distance L2 between the upstream end of a fin group and the downstream end of a fin group adjoining thereto defines an interval between adjoining offset sections (hereinbelow referred to as offset section interval). In FIG. 10, the distance L2 is set to 2 mm.

FIGS. 9 and 10 show parameters used for the analysis.

In the simulation, two offset positions that are located in the upstream of an offset section OF, which corresponds to the front surface of a chip at which the offset position is zero, and one offset position that is located downstream of the offset section OF were used for the analysis. In addition, three offset section intervals were used. The maximum temperature (° C.) of the heat generating portion was analyzed for each combination of the offset positions and the offset section intervals.

Figure 11:
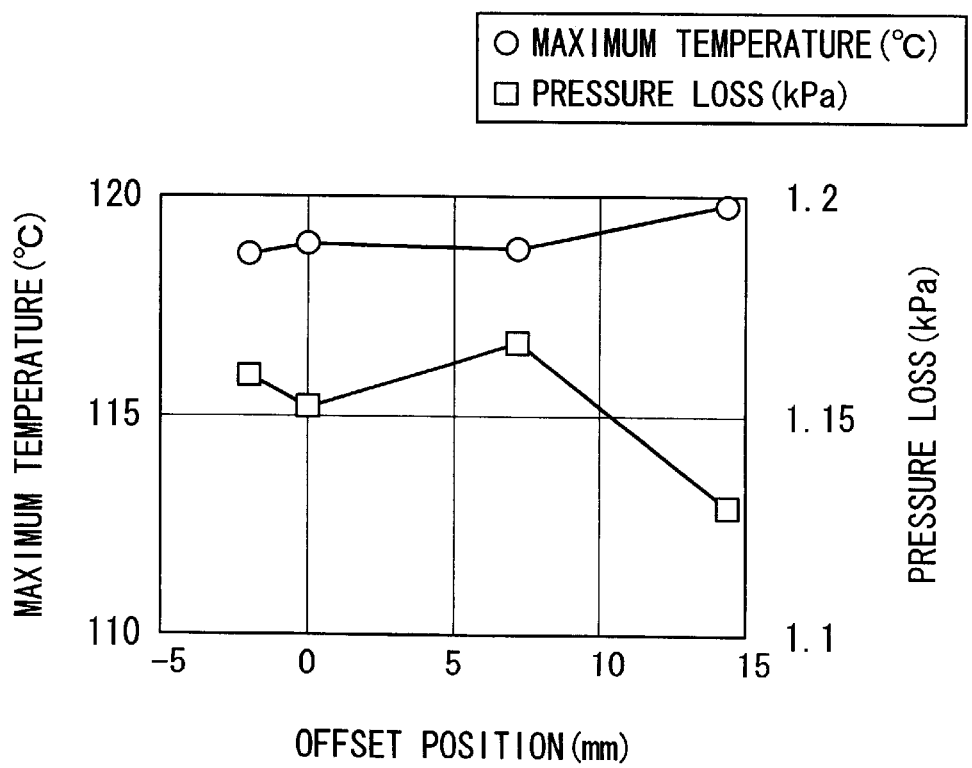
FIG. 11 is a graph showing the relationship of the offset position of the fins and the maximum temperature, and the relationship of the offset position of the fin and the pressure loss.
Figure 12:
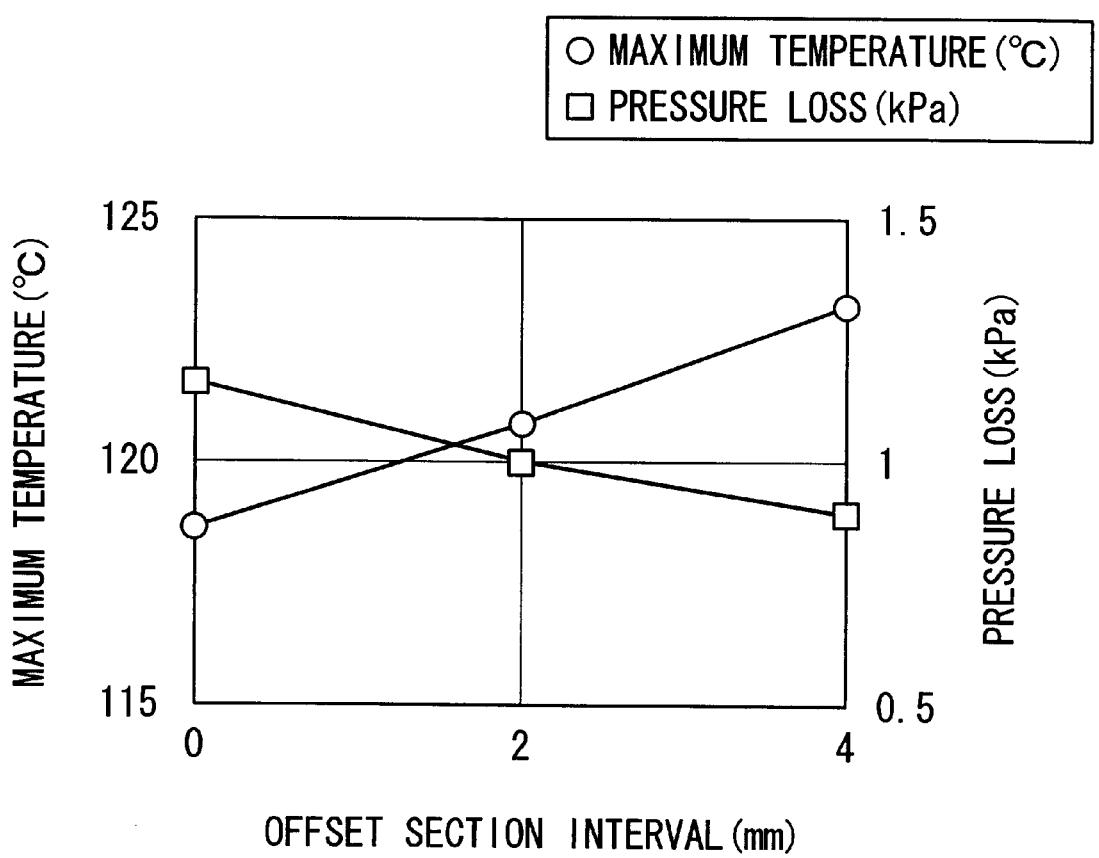
FIG. 12 is a graph showing the relationship of intervals between the offset sections of the fins and the maximum temperature, and the relationship of the intervals between the offset sections of the fins and pressure loss.

As shown in FIGS. 11 and 12, the results of the analysis reveal the following.

(1) An amount of change in the maximum temperature of the chip is small with respect to an amount of change in the offset position (refer to FIG. 11).

(2) As the offset section interval becomes wider, the pressure loss falls and the maximum temperature of the chip rises (refer to FIG. 12).

In view of the above, in the present embodiment, the offset position is set to 0 mm (corresponding to the front surface of the chip) and the offset section interval is set to 0 mm.

The specification of the heat sink 5 was as follows: a base plate was composed of aluminum (A3003); the fin was composed of aluminum (A1100); a mixed liquid of pure water and ethylene glycol was used as the coolant; the temperature of the coolant was set to 65° C.; and the flow rate of the coolant was set to 16 liters/minute.

When the fin 22 in which the pitch p is set to 5.5 mm and the thickness d is set to 0.6 mm is used, the offset Δd between adjoining fins 22 shown in FIG. 5, namely, the interval in the thickness direction between adjoining fins 22 is set to 2.15 mm.

Next, the operation of the cooling device will be described.

When electric power is supplied to the main motor 1 from the fuel cell stack 3 through the power control unit 2, the temperature of the electronic devices 8 of the power control unit 2 rises. On the other hand, the coolant that was cooled by the radiator 27 and was forwarded by the water pump 28 flows through the passage 6, which meanders from the inlet 14 to the outlet 15 of the heat sink 5 that is monolithically integrated in the power control unit 2. Accordingly, the heat generated by the electronic devices 8 of the power control unit 2 is conducted through the heat sink 5 and is removed by the coolant, thereby suppressing the temperature rise of the electronic devices 8 of the power control unit 2.

Since the fin groups 21 are placed just under the power drive unit 12 for the main motor 1 that generates the maximum amount of heat among the devices provided in the power control unit 2, the amount of heat dissipated by means of the coolant can be enhanced by the fins 22, which increase the heat dissipating area. Therefore, the heat produced by the electronic devices 8 that is provided on the power drive unit 12 can be removed efficiently.

As described above, the offset sections OF are provided in which the fin groups 21 are placed at a distance in the width direction of the passage 6 in a manner such that a fin 22 of a fin group 21 and another fin 22 of another fin group 21 adjoining the fin group 21 in parallel with the direction of the flow are placed at a distance in the thickness direction of the fins 22. For this reason, when the coolant flows from the fin group 21 to another fin group 21, the coolant flow becomes turbulent due to the presence of the offset sections OF, so that it is possible to remove greater amounts of heat from the electronic devices 8 through the fins 22.

In other words, since the offset sections OF are provided, coolant flow from two adjoining spaces formed by three adjoining fins 22 of the upstream fin group 21 flows into a space between adjoining fins 22 of the downstream fin group 21. In other words, the coolant flow from the upstream fin group 21 joins at the space between the adjoining fins 22 of the downstream fin group 21 to make the coolant flow turbulent.

In addition, when the coolant flowing between the fins 22 of the upstream fin group 21 reaches the downstream fin group 21 adjoining thereto in parallel with the direction of the flow, the coolant flowing near the surfaces of the fins 22 of the upstream fin group 21 flows at portions at a distance of the offset A d from the surfaces of the fins 22 of the downstream fin group 21. Conversely, a part of the coolant flowing at the spaces between the fins 22 of the upstream fin group 21 flows near the surfaces of the fins 22 of the downstream fin group 21. In this way, the coolant flows near the surfaces of the fins 22 uniformly while the coolant passes along the upstream fin group 21 and the down stream fin group 21, and it is therefore possible to efficiently remove heat from the fins 22.

Further, since the device arrangement portions 26 are provided at the positions closest to the fin groups 21, in other words, in an area on the upper surface 7 of the power control unit 2 corresponding to the area where the fin groups 21 are arranged, it is possible to efficiently remove heat from the electronic devices 8 that should be further cooled in preference to other devices.

Moreover, because a fin group 21 and another fin group 21 adjoining thereto in parallel with the direction of the flow are disposed closely, it is possible to enhance the effect of turbulent flow, which is generated by an arrangement in which the fins 22 are placed at a distance in the thickness direction, as much as possible, thereby further enhancing the capacity to remove heat.

Further, since the structure in which turbulent flow generated by the offset sections OF enhances the capacity to remove heat is employed, it is possible to lower the height of the fins 22 in accordance with an increase in the capacity to remove heat. Therefore, the height of the heat sink 5 can be lowered. As a result, the cooling device according to the present embodiment is suitable for mounting in vehicles in which a space for arranging various devices is substantially limited, especially in fuel cell vehicles in which a number of devices must be arranged.

The present invention is not limited to the above-described embodiment, and it may be embodied in other forms. For example, although the turnings of the passage 6 are provided at left and right portions in FIG. 2 in the above embodiment, they may be provided at top and bottom portions according to the arrangement of the electronic devices 8 mounted on the heat sink. In addition, although the fin groups 21 are only arranged just under the power drive unit 12 for the main motor 1 in the above embodiment, they may also be arranged just under other electronic devices 8. Furthermore, the sizes of the fin groups 21 are not limited to those described in the above embodiment.

Moreover, although it is assumed that the cooling device is mounted in fuel cell vehicles in the above embodiment, it may be mounted in electric vehicles or fuel cell stacks installed in equipment other than vehicles.

What is claimed is:

1. A heat sink-type cooling device comprising:
a heat sink which is provided with a passage through which coolant flows, and a plurality of discrete fin groups being relocatable within the passage, each fin group being comprised of a plurality of fins that are disposed in parallel with a direction of the flow,
wherein the heat sink removes heat from a heat source which contacts with a surface of the heat sink, and the fin groups are arranged discretely in the direction of the flow to obtain increased performance by relocating the fin groups, and a fin of a fin group and another fin of another fin group adjoining to the fin group in the direction of the flow are arranged at an offset distance in the thickness direction of the fins, and adjoining fin groups contact with each other in the direction of the flow.

2. A heat sink-type cooling device according to claim 1, wherein a surface of the heat sink is provided with a heat source arrangement portion for arranging the heat source at the position closest to the fin groups.

3. A heat sink-type cooling device according to claim 1, wherein the fin groups are arranged in a manner such that coolant flow from two adjoining spaces formed by three adjoining fins of the upstream fin group joins at a space between adjoining fins of the downstream fin group to make the coolant flow turbulent.

4. A heat sink-type cooling device according to claim 1, wherein the fin groups are arranged in a manner such that the coolant flowing near a surface of the fins of an upstream fin group flows at portions distant from the surface of the fins of a downstream fin group contacting the upstream fin group in the direction of the flow, and a part of the coolant flowing at spaces between the fins of the upstream fin group flow near the surface of the fins of the downstream fin group.

5. A heat sink-type cooling device according to claim 1, wherein the pitch of the fin is made as narrow as possible and the thickness of the fin is made as thick as possible without blocking the flow.

\* \* \* \* \*